(12) United States Patent
Takagi

(10) Patent No.: US 7,888,797 B2
(45) Date of Patent: Feb. 15, 2011

(54) HIGH FREQUENCY PACKAGE DEVICE WITH INTERNAL SPACE HAVING A RESONANT FREQUENCY OFFSET FROM FREQUENCY USED

(75) Inventor: Kazutaka Takagi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/367,460

(22) Filed: Mar. 6, 2006

(65) Prior Publication Data
US 2007/0007647 A1 Jan. 11, 2007

(30) Foreign Application Priority Data
Jul. 11, 2005 (JP) .............................. 2005-201745

(51) Int. Cl.
*H01L 23/043* (2006.01)
*H01L 23/10* (2006.01)

(52) U.S. Cl. ................ 257/728; 257/730; 257/E23.183; 257/E23.193

(58) Field of Classification Search ................. 257/728, 257/729, 730, 731, 698, E23.181, E23.182, 257/E23.183, E23.185, E23.191, E23.193
See application file for complete search history.

(56) References Cited

U.S. PATENT DOCUMENTS

| | | | | | |
|---|---|---|---|---|---|
| 4,568,896 | A | * | 2/1986 | Ichitsubo | 333/238 |
| 4,975,762 | A | * | 12/1990 | Stradley et al. | 257/660 |
| 5,268,533 | A | * | 12/1993 | Kovacs et al. | 174/562 |
| 5,527,992 | A | * | 6/1996 | Terajima | 174/551 |
| 5,898,909 | A | * | 4/1999 | Yoshihara et al. | 455/73 |
| 6,163,072 | A | * | 12/2000 | Tatoh | 257/704 |
| 6,300,673 | B1 | * | 10/2001 | Hoffman et al. | 257/666 |
| 6,365,961 | B1 | * | 4/2002 | Tomie | 257/664 |
| 6,392,298 | B1 | * | 5/2002 | Leighton et al. | 257/728 |

(Continued)

FOREIGN PATENT DOCUMENTS

EP    1 363 331 A2    11/2003

(Continued)

OTHER PUBLICATIONS

U.S. Appl. No. 12/579,023, filed Oct. 14, 2009, Takagi, et al.

(Continued)

*Primary Examiner*—David Vu
*Assistant Examiner*—Earl N Taylor
(74) *Attorney, Agent, or Firm*—Oblon, Spivak, McClelland, Maier & Neustadt, L.L.P.

(57) ABSTRACT

A lid forms an internal space on a bottom plate together with a plurality of side walls. A dielectric plate on the bottom plate in the internal space has a smaller width than an inner surface of the lid. A projection on the inner surface of the lid has a surface area, where a distance between the projection and the bottom plate where the projection is provided is shorter than a distance between the lid and the bottom plate where the projection is not provided. The lid and the projection are coupled to pass a current therebetween. The inner surface of the lid extends further toward an inner surface of one of the side walls than does the projection. The bottom plate, the side walls, the lid, and the projection are composed of metal material. The lid and the projection are composed of the same metal material.

11 Claims, 3 Drawing Sheets

U.S. PATENT DOCUMENTS

| | | | |
|---|---|---|---|
| 6,472,962 B1 * | 10/2002 | Guo et al. | 333/262 |
| 6,528,347 B2 * | 3/2003 | Hirata et al. | 438/108 |
| 6,531,668 B1 * | 3/2003 | Ma | 200/181 |
| 6,611,054 B1 * | 8/2003 | Dunaway et al. | 257/704 |
| 6,741,142 B1 * | 5/2004 | Okazaki et al. | 333/99 S |
| 6,822,541 B2 * | 11/2004 | Sue et al. | 333/247 |
| 2002/0067313 A1 * | 6/2002 | Kondoh et al. | 343/700 MS |
| 2003/0001461 A1 * | 1/2003 | Kim et al. | 310/359 |
| 2004/0021156 A1 * | 2/2004 | Asano et al. | 257/222 |
| 2004/0036559 A1 * | 2/2004 | Sue et al. | 333/247 |
| 2005/0017177 A1 * | 1/2005 | Tai et al. | 250/338.4 |
| 2005/0030231 A1 * | 2/2005 | Nagaishi et al. | 343/700 MS |
| 2005/0035896 A1 * | 2/2005 | Fujieda et al. | 342/1 |
| 2005/0104792 A1 * | 5/2005 | Asao et al. | 343/767 |
| 2006/0076648 A1 * | 4/2006 | Gally et al. | 257/619 |
| 2006/0139903 A1 * | 6/2006 | Takagi | 361/764 |

FOREIGN PATENT DOCUMENTS

| | | |
|---|---|---|
| JP | 1-107141 | 7/1989 |
| JP | 1-314401 | 12/1989 |
| JP | 5-83010 | 4/1993 |
| JP | 5-110310 | 4/1993 |
| JP | 05-121888 | 5/1993 |
| JP | 11-238823 | 8/1999 |
| JP | 2000-236045 * | 8/2000 |
| JP | 2002343982 A * | 11/2002 |
| JP | 2003008309 A * | 1/2003 |
| JP | 2003060101 A * | 2/2003 |
| JP | 2003-197798 | 7/2003 |
| JP | 2004047576 A * | 2/2004 |
| JP | 2004111570 A * | 4/2004 |
| JP | 2004214577 A * | 7/2004 |
| JP | 2005-50861 | 2/2005 |

OTHER PUBLICATIONS

U.S. Appl. No. 12/507,287, filed Jul. 22, 2009, Takagi.

* cited by examiner

HIGH FREQUENCY PACKAGE DEVICE WITH INTERNAL SPACE HAVING A RESONANT FREQUENCY OFFSET FROM FREQUENCY USED

CROSS-REFERENCE TO RELATED APPLICATIONS

This application is based upon and claims the benefit of priority from the prior Japanese Patent Application No. 2005-201745, filed on Jul. 11, 2005; the entire contents of which are incorporated herein by reference.

TECHNICAL FIELD

The present invention relates to a high frequency package device for storing high frequency circuit used in high frequency bands such as microwave or millimeter wave band.

BACKGROUND TECHNOLOGY OF THE INVENTION

High frequency circuits used in high frequency bands are composed of circuit elements, for example, semiconductor elements, capacitors, coils or strip lines, and are stored in an internal space in a high frequency package device.

The internal space of the high frequency package device corresponds to a sort of cavity in an electromagnetic field. Therefore, it has a resonant frequency dependent on the width of the internal space. A high frequency circuit provided in an internal space is usually used in a frequency band different from the resonant frequency dependent on the internal space width. For example, a resonant frequency dependent on the internal space width is made higher than the frequency used for the high frequency circuit.

Meanwhile, high frequency circuit stored in high frequency package device has increased in its output power in recent years. With increasing of the output power, number of circuit elements is apt to increase and thus the width of internal space is apt to increase. When the width of the internal space increases, the resonant frequency decreases. As the result, the resonant frequency and the frequency used for the high frequency circuit are getting closer, and thus electric characters of the high frequency circuit degrades.

In the conventional high frequency package device, a space is divided into two by a separation wall, for example, to make the resonant frequency high when the internal space is very wide, in order to solve the above-mentioned problems (See the Japanese published Patent Application H5-83010). Alternatively, a height of the internal space is made large with a lid composing the resonant frequency being placed at high position (See the Japanese published Patent Application 2000-236045).

However, the method of dividing the internal space with the separation wall sometimes has a drawback that the side wall composing the internal space and the separation wall have different heights resulting in a gap generated at the junction portion between the lid closing an opening of the side wall and the separation wall. Thus, a waveguide mode is generated to degrade electric characteristics of the high frequency package device. On the other hand, the method of increasing the height of internal space has another problem that the height of the package becomes several times as high as an original one if the resonant frequency is required to be changed in sufficient amount, because a degree of the changing the resonant frequency become small as the height of internal space becomes higher.

SAMARY OF THE INVENTION

A high frequency package device according to one embodiment of the present invention includes a bottom plate, a side wall provided on the bottom plate surrounding a space above the bottom plate, a lid which closes an opening formed by the side wall and forms an internal space on the bottom plate together with the side wall, a dielectric plate arranged on the bottom plate in the internal space, and an input line and an output line penetrating the side wall, a projection provided on an inner surface of the lid for forming a region where a distance between the lid and the bottom plate is shorter than a region where the projection is not provided.

BRIEF DESCRIPTION OF THE DRAWINGS

A more complete appreciation of embodiment of the present invention and many of its attendant advantages will be readily obtained by reference to the following detailed description considered in connection with the accompanying drawings, in which.

DETAILED DESCRIPTION OF THE EMBODIMENT

Figure 1:
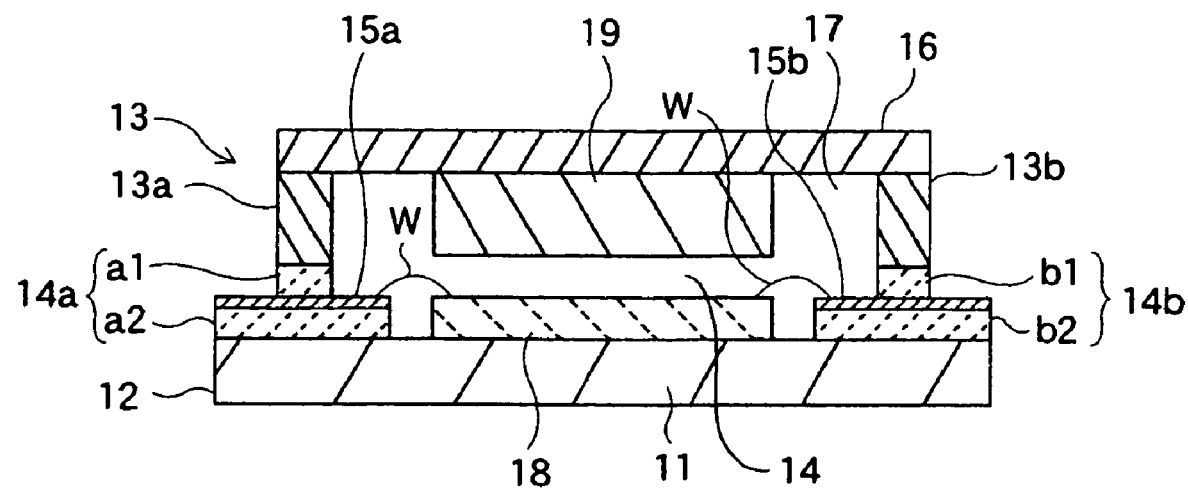
FIG. 1 is a cross sectional view of an exemplary high frequency package device according to an embodiment of the present invention.

An exemplary high frequency package device according to an embodiment of the present invention will be explained referring to FIG. 1.

A high frequency package is provided with a bottom plate 11. The bottom plate 11 is composed of a metal plate 12. A side wall 13 which is formed, for example, in a shape of rectangular frame as a whole is provided on the bottom plate 11 so as to surround a space above the bottom plate 11. The side wall 13 has a predetermined height and a width. The side wall 13 is composed of metal as a whole. However, a part of side wall, for example, portions 13a, 13b on opposite sides of the rectangular frame are formed with dielectric member 14a, 14b.

Each of the dielectric member 14a, 14b is composed of upper stage a1, b1 having equal width to metallic side wall 13, and lower stage a2, b2 having larger width than the metallic side wall 13. The lower stages a2, b2 of the dielectric member 14a, 14b have inner ends protruded in the internal space 14 and outer ends protruded outside the internal space 14. A band-shaped input line 15a is formed along the full width of the lower stage a2. Therefore, an input line 15a penetrates between the upper stage a1 and the lower stage a2. Also, a band-shaped output line 15b is formed along the full width of lower stage b2. An output line 15b penetrates between the upper stage bland the lower stage b2.

An opening formed by the frame-shaped side wall 13 is sealed with a lid 16, and an air tight internal space 17 is formed on the bottom plate 11 by the side wall 13 and the lid.

A dielectric plate 18 is arranged on the bottom plate 11 located between two dielectric members 14a, 14b. On the dielectric plate 18, a high frequency circuit (not illustrated) including high frequency transistor, input matching circuit, an output matching circuit and other circuit elements, is formed. Wires W connects between the input line 15a and the high frequency circuit and between the high frequency circuit and the output line 15b.

A projection 19 protruding toward the bottom plate 11 is formed on a inner surface of the lid 16 at a position between the input line 15a and the output line 15b, for example. As the result, a region where a distance between the lower surface of the projection 19 formed on the inner surface of the lid 16 and the bottom plate 11 is shorter than the distance between the lower surface of the lid 16 where the projection 19 is not formed and the bottom plate 11. The projection 19 is made of a same metal material as the lid 16, by joining a metal plate with the lid 16 for example. Here, copper, alloy of copper and molybdenum, or a laminated board consisting of these metals are used as a metal material composing the high frequency package device.

Figure 2:
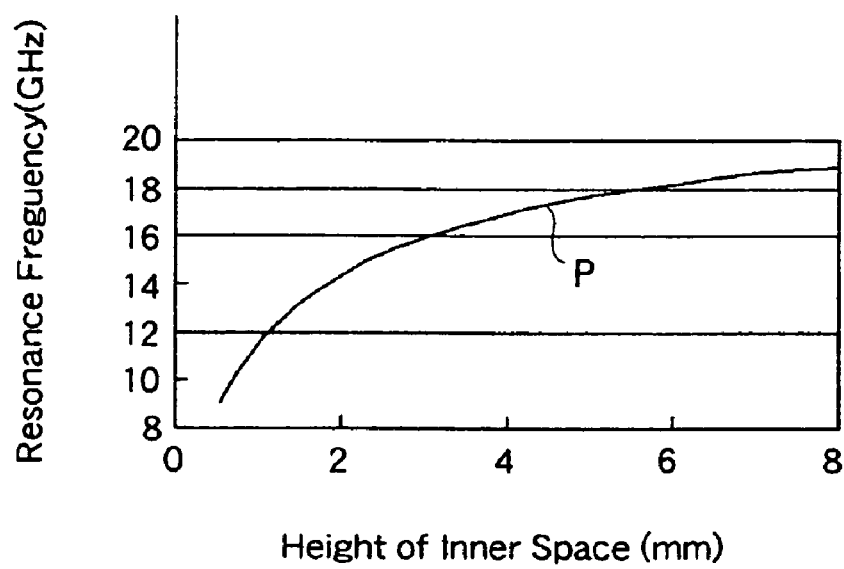
FIG. 2 is a graph showing an example of resonant frequency characteristics of the internal space in the high frequency package device shown in FIG. 1.
Figure 3:
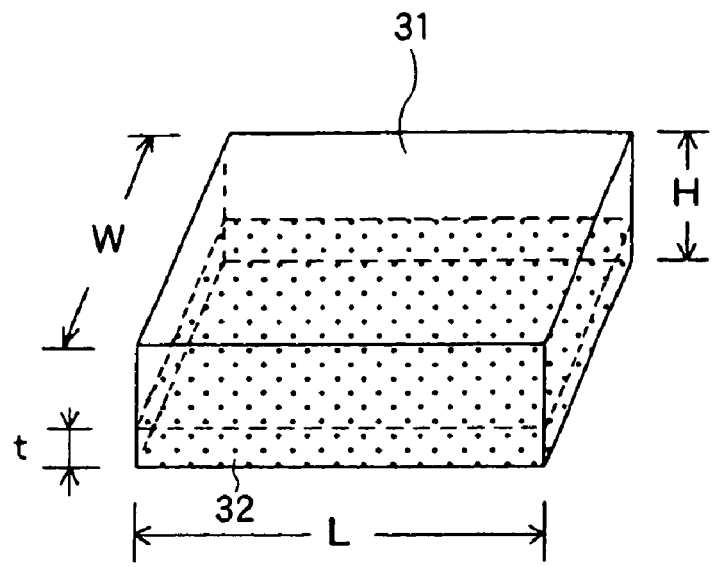
FIG. 3 is an exemplary perspective view of the internal space in the high frequency package device shown in FIG. 1 for explaining the resonant frequency characteristics.

FIG. 2 is a graph showing an example of a resonant frequency characteristics P of the internal space when a projection is provided on the inner surface of the lid. In FIG. 2, the abscissa indicates height of internal space H (mm) and the ordinate indicates resonant frequency (GHz). Here, the internal space 31 has a width W of 16 mm and a length equal to a length of the dielectric plate 32 as shown in FIG. 3. The dielectric plate 32 is made of alumina, with the thickness t of 0.25 mm.

As can be seen from the resonant frequency characteristics P in FIG. 2, the resonant frequency of the internal space becomes low when the height H of the internal space becomes small. The reason is that when the height H of the internal space becomes small, a ratio of the thickness of the dielectric plate layer to the height H of the internal space becomes greater than the ratio of the thickness of an air layer to the height H of the internal space, and thus, the ratio of the thickness of the dielectric plate layer having a higher specific dielectric constant than that of air layer to the thickness of the air layer becomes large, thereby effectively increasing the relative dielectric constant in the internal space as a whole.

Thus, the resonant frequency of the internal space can be decreased by providing the projection on the inner surface of the lid to reduce the height of the internal space. As the result, the resonant frequency of the internal space can be set apart greatly from the frequency band used for the high frequency circuit, so that the electric characteristics of the high frequency package device is prevented from deterioration.

According to the embodiment, the size of the device is kept small, because the device has such a simple structure that only the projection is formed on the inner surface of the lid. Further, the production of the device is easy because the projection can be formed by simply joining a metal plate to the lid.

Further, variation in the resonant frequency with respect to variation in the height H of the internal space is large in the region where the height H of the internal space is low, as can be seen from the resonant frequency characteristics P in FIG. 2. Therefore, the resonant frequency can be varied greatly with small change in the height of the projection. It is possible in the above embodiment that the projection is not formed over the input line 15a or the output line 15b, so that it is also possible to prevent the wires from contacting with the input line 15a or the output line 15b.

Figure 4A:
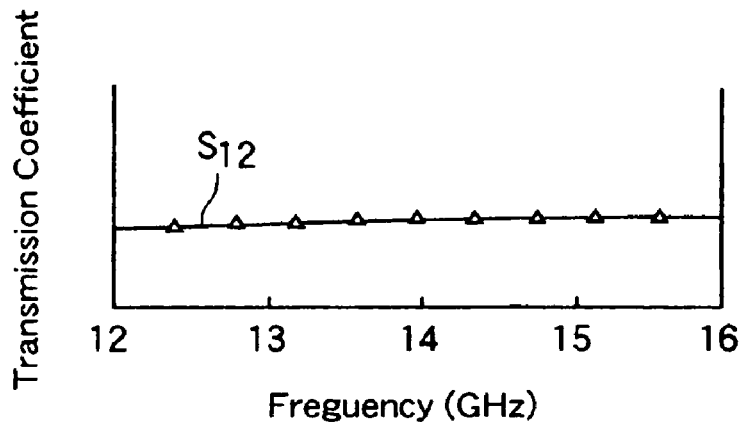
FIG. 4A to 4C are graphs showing examples of the resonant frequency characteristics when a width and a height of the internal space shown in FIG. 3 is varied.
Figure 4B:
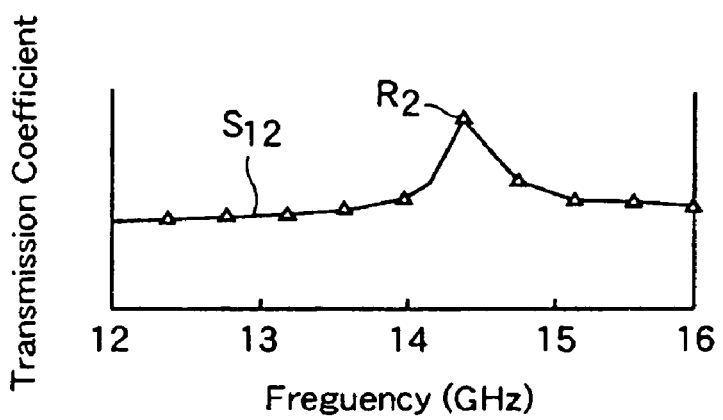
Figure 4C:
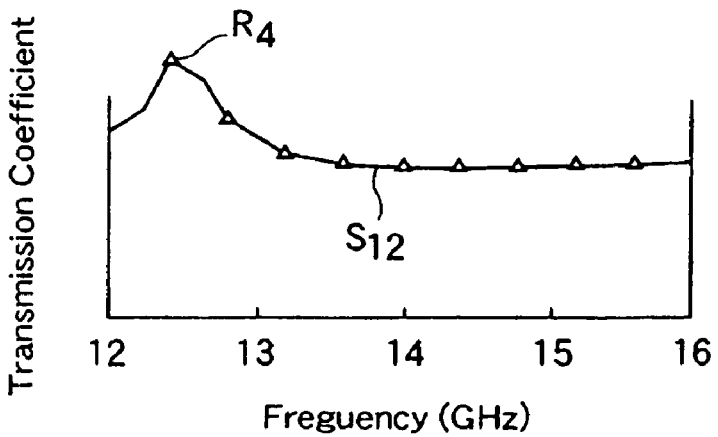

FIGS. 4A to 4C are graphs showing examples of transmission coefficient S12 in the internal space shown in FIG. 3, when the thickness t of the dielectric plate is constant (t=0.25 mm) and when the width W and the height H of the internal space are varied. The abscissas in FIGS. 4A to 4C are frequency (GHz), ordinates are transmission coefficient S12. Here, transmission coefficient S12 is a ratio of high frequency energy obtained on an output side to the high frequency energy supplied on an input side of the internal space shown in FIG. 3.

FIG. 4A shows an example of the resonant characteristics when the internal space width W is 8 mm and the height H is 2 mm, where resonance of the internal space does not occur in the frequency band (14 GHz band) used for the circuit, because the internal space width W is narrow.

FIG. 4B shows an example of the resonant characteristics when the internal space width W is 16 mm and height H is 2 mm, where the resonance R2 of the internal space is generated in the frequency band (14 GHz band) used for the circuit.

FIG. 4C shows an example of the resonant characteristics when the internal space width W is 16 mm and height H is 0.5 mm, which is lower than the height of the internal space shown in FIG. 4B, where the resonance R4 of the internal space shifts to lower frequency (in 12.5 GHz frequency band).

As can be seen from the relations in FIGS. 4A to 4C, even if the resonant frequency appears, as shown in FIG. 4B, to go down and close to the frequency band used for the high frequency circuit when the internal space width expands, for example, from 8 mm to 16 mm, those frequencies can be separated from each other, by providing a projection on the inner surface of the lid and lowering the height H of the internal space, so that the electric characteristics of the high frequency package device is prevented from deterioration.

Figure 5:
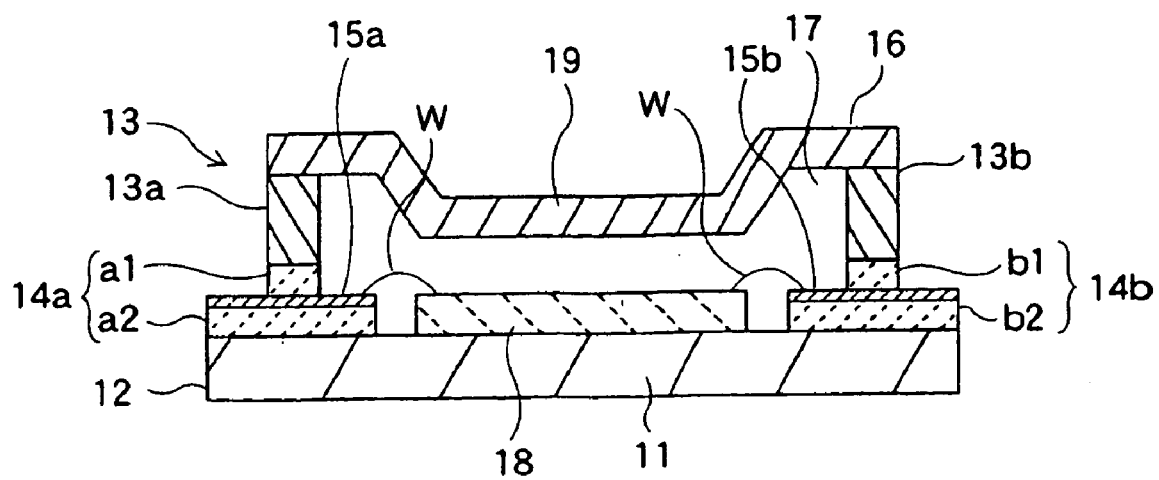
FIG. 5 is a cross sectional view of an example high frequency package device according to another embodiment of the present invention.

Next, another embodiment of the present invention will be explained referring to the cross sectional view of FIG. 5. In FIG. 5, the same symbols are assigned to the corresponding parts to those in FIG. 1, and duplicating explanations are omitted.

In this embodiment, a projection 19 at the metal lid 16 is formed by draw processing of the lid 16. Also in this case, height H of the internal space 17, namely the distance between the inner surface of the lid 16 and the bottom plate 11 is decreased, so that a similar function as in the device shown in FIG. 1 is obtained.

In the embodiment of FIG. 1 and FIG. 5, one dielectric plate 18 is arranged on the bottom plate 11 in the internal space 17. However, more than one dielectric plate 18 may be arranged on the bottom plate 11 or other circuit elements may be arranged together with the dielectric plate 18.

The foregoing description of a preferred embodiment of the invention has been presented for purposes of illustration and description. It is not intended to be exhaustive or to limit the invention to the precise form disclosed, and modifications and variations are possible in light in the above teachings or may be acquired from practice of the invention. The embodiments (which can be practiced separately or in combination) were chosen and described in order to explain the principles of the invention and as practical application to enable one skilled in the art to utilize the invention in various embodiments and with various modifications are suited to the particular use contemplated. It is intended that the scope of the invention be defined by the claims appended hereto and their equivalents.

The invention claimed is:

1. A high frequency package device, comprising:
   a bottom plate;

a plurality of side walls provided on the bottom plate to surround a space above the bottom plate;

a lid to close an opening formed by the plurality of side walls and to form an internal space on the bottom plate together with the plurality of side walls;

a dielectric plate arranged on the bottom plate in the internal space, having a smaller width than an inner surface of the lid;

an input line to penetrate a first one of the plurality of side walls;

an output line to penetrate a second one of the plurality of sidewalls; and a projection provided on the inner surface of the lid to form a region facing the dielectric plate and to have a surface area, facing the dielectric plate, where a distance between the projection and the bottom plate where the projection is provided is shorter than a distance between the lid and the bottom plate where the projection is not provided, the lid and the projection coupled to pass a current therebetween, wherein the inner surface of the lid extends further toward an inner surface of one of the plurality of side walls than does the projection extend to the inner surface of the one of the plurality of side walls, wherein the bottom plate, the plurality of side walls, the lid, and the projection are composed of metal material, and the lid and the projection are composed of the same metal material.

2. The high frequency package device according to claim 1, wherein the projection is located between the input line and the output line.

3. The high frequency package device according to claim 2, wherein the projection is formed by joining a metal plate on a part of the inner surface of the lid.

4. The high frequency package device according to claim 3, wherein the plurality of side walls are formed in a frame shape, the plurality of side walls comprises two parts positioned at an opposing two of the plurality of side walls, the two parts formed of a dielectric material, and the input line and the output line penetrate the dielectric material.

5. The high frequency package device according to claim 4, wherein the projection is formed at a position opposite to the dielectric plate.

6. The high frequency package device according to claim 5, wherein the dielectric plate is a ceramic plate.

7. The high frequency package device according to claim 5, wherein
   the dielectric material includes
      an upper stage having a same thickness as the one of the plurality of side walls, and
      a lower stage having a larger thickness than the one of the plurality of side walls, and
   the input line or the output line is laminated on an upper surface of the lower stage.

8. The high frequency package device according to claim 7, wherein a high frequency circuit is formed on the dielectric plate.

9. The high frequency package device according to claim 1, wherein the dielectric plate has a thickness that is less than a distance between the dielectric plate and the projection.

10. The high frequency package device according to claim 1, wherein the projection is adjacent to and abutting the lid.

11. The high frequency package device according to claim 1, wherein the projection is not formed over the input line or the output line.

* * * * *